United States Patent
Meyer-Berg et al.

(10) Patent No.: US 9,331,019 B2
(45) Date of Patent: May 3, 2016

(54) DEVICE COMPRISING A DUCTILE LAYER AND METHOD OF MAKING THE SAME

(71) Applicant: Infineon Technologies AG, Neubiberg (DE)

(72) Inventors: Georg Meyer-Berg, Munich (DE); Reinhard Pufall, Munich (DE)

(73) Assignee: Infineon Technologies AG, Neubiberg (DE)

( * ) Notice: Subject to any disclaimer, the term of this patent is extended or adjusted under 35 U.S.C. 154(b) by 18 days.

(21) Appl. No.: 13/689,511

(22) Filed: Nov. 29, 2012

(65) Prior Publication Data

US 2014/0145333 A1    May 29, 2014

(51) Int. Cl.
    *H01L 23/48*    (2006.01)
    *H01L 23/532*    (2006.01)
    *G01R 31/26*    (2014.01)
    *G01R 31/28*    (2006.01)
    *H01L 23/58*    (2006.01)
    *H01L 21/768*    (2006.01)
    *H01L 23/00*    (2006.01)

(52) U.S. Cl.
CPC .......... *H01L 23/53204* (2013.01); *G01R 31/26* (2013.01); *G01R 31/28* (2013.01); *G01R 31/2853* (2013.01); *H01L 21/7685* (2013.01); *H01L 23/58* (2013.01); *H01L 24/05* (2013.01); *G01R 31/2884* (2013.01); *H01L 2224/02166* (2013.01); *H01L 2224/05556* (2013.01); *H01L 2924/12042* (2013.01); *H01L 2924/1301* (2013.01); *H01L 2924/1305* (2013.01); *H01L 2924/13055* (2013.01); *H01L 2924/13091* (2013.01); *H01L 2924/181* (2013.01)

(58) Field of Classification Search
CPC ............ H01L 2924/00; H01L 21/7685; H01L 23/53204; H01L 23/58; G01R 31/26; G01R 31/28
USPC ........... 257/751, E21.646, E27.084; 438/612, 438/127
See application file for complete search history.

(56) References Cited

U.S. PATENT DOCUMENTS

| | | | |
|---|---|---|---|
| 5,776,826 A * | 7/1998 | Mitwalsky et al. | 438/622 |
| 6,506,672 B1 * | 1/2003 | Dagenais et al. | 438/612 |
| 6,951,801 B2 | 10/2005 | Pozder et al. | |
| 6,960,831 B2 | 11/2005 | Burrell et al. | |
| 7,666,712 B2 | 2/2010 | Awad et al. | |
| 7,985,671 B2 | 7/2011 | Daubenspeck et al. | |
| 8,076,238 B2 | 12/2011 | Hosseini et al. | |
| 2005/0140382 A1 * | 6/2005 | Wilson et al. | 324/754 |
| 2006/0033516 A1 * | 2/2006 | Rincon et al. | 324/754 |
| 2006/0091537 A1 | 5/2006 | Suzuki | |
| 2009/0087948 A1 * | 4/2009 | Lange et al. | 438/108 |
| 2009/0273963 A1 * | 11/2009 | Nagai | 365/145 |
| 2014/0021622 A1 * | 1/2014 | Bonilla et al. | 257/773 |

* cited by examiner

*Primary Examiner* — Matthew Gordon

(74) *Attorney, Agent, or Firm* — Slater & Matsil, L.L.P.

(57) ABSTRACT

Device comprising a ductile layer, a method for making a component comprising a ductile layer and a method for testing a component are disclosed. An embodiment includes an electronic device including a first conductive layer, a ductile layer and a brittle layer between the first conductive layer and the ductile layer.

17 Claims, 7 Drawing Sheets

DEVICE COMPRISING A DUCTILE LAYER AND METHOD OF MAKING THE SAME

TECHNICAL FIELD

The present invention relates generally to fabrication of semiconductor devices and, more particularly, to test structures and methods for testing semiconductor devices.

BACKGROUND

Packaged semiconductor chips are manufactured by a plurality of processing steps including a cutting step. The manufacturing and cutting process may create or cause die-cracks or chipping in the singulated chips.

SUMMARY OF THE INVENTION

In accordance with an embodiment of the present invention, a component comprises a substrate, a first metal line disposed over the substrate, and an insulating layer disposed over the first metal line. The component further comprises a second metal line disposed over the insulating layer and a ductile metal layer disposed between the first metal line and the second metal line.

In accordance with an embodiment of the present invention, a component comprises a semiconductor substrate and an interconnect metallization structure disposed on the semiconductor substrate, the interconnect metallization structure comprising a top metal line. The component further comprises an insulating layer disposed on the interconnect metallization structure, a bond pad disposed on the insulating layer and a metal layer between the bond pad and the top metal line, wherein a metal of the metal layer is configured to move into a potential crack in the insulating layer.

In accordance with an embodiment of the present invention, a method for manufacturing a component comprises forming a top metal line over a substrate and forming an insulating layer over the top metal line. The method further comprises forming a ductile metal layer over the top metal line before or after forming the insulating layer and forming a bond pad over the ductile metal layer such that the insulating layer is between the ductile metal layer and the bond pad or between the ductile metal layer and the top metal line.

In accordance with an embodiment of the present invention, a method for testing comprises providing a packaged component having a ductile metal layer between a top metal layer and a bond pad disposed on the top metal layer, and electrically testing the packaged component.

In accordance with an embodiment of the present invention, an electronic device comprises a first conductive layer, a ductile layer and a brittle layer between the first conductive layer and the ductile layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Packaged semiconductor arrangements are often singulated into individual packaged chips or dies after the packaged semiconductor arrangements are formed.

Processing and cutting the packaged semiconductor arrangements can create cracks and chippings. Cracks or chippings can often be seen without the help of evaluation tools because they are visible on the surface of the packaged chip. However, some cracks in and on the chips may damage the packaged chip without being visible.

The present invention will be described with respect to embodiments in a specific context, namely, a crack detection structure for semiconductor chips. Embodiments of the invention may also be applied, however, to other applications that would benefit from crack detection structures.

Embodiments of the present invention provide a crack detection structure comprising a ductile metal layer. Embodiments of the present invention provide a ductile metal layer between a bond pad and a metal layer of an interconnect metallization structure.

An advantage of an embodiment of the present invention is that invisible damage to the chip can be detected. Furthermore the (invisible) cracks and chippings can be detected with a standard electrical test.

Figure 1A:
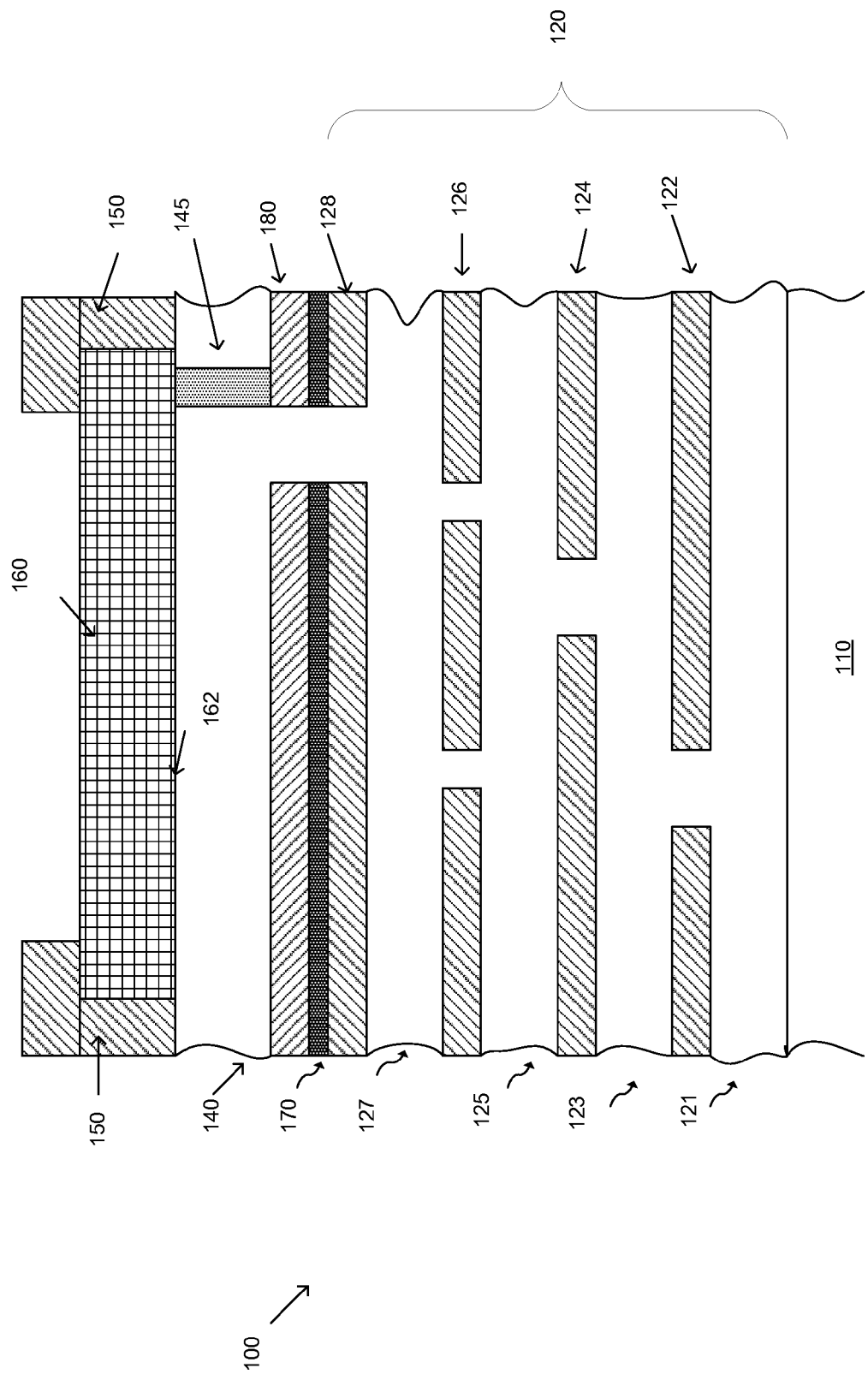
FIG. 1a shows an embodiment of a detail of a component.

FIG. 1a shows an embodiment of a component 100 comprising a crack detection structure. The component 100 comprises a workpiece or substrate 110 and an interconnect metallization structure 120 disposed thereon. The substrate 110 may be a semiconductor substrate such as silicon or germanium, or a compound substrate such as SiGe, GaAs, InP, GaN, SiC, or alternatively other materials. The semiconductor substrate may be a single crystal silicon or a silicon-on insulator (SOI). The substrate may be doped or undoped and may comprise one or more wells.

The interconnect metallization structure 120 may comprise one or more interconnect metallization layers 122-128. The interconnect metallization structure 120 is a mesh of conductive lines 122-128 and plugs/vias (not shown) embedded in an insulation material 121-127. For example, the interconnect metallization structure 120 may comprises four metallization levels 122-128 separated from each other by three insulation layers 123-127 (vias are not shown in the interconnect metallization structure). The insulation material of the insulation layers 121-127 comprises silicon dioxide, low dielectric constant materials or ultra low dielectric constant materials (low-k materials). Low-k materials have a k value less than the k value of silicon dioxide. The conductive lines and plugs/vias may comprise copper or aluminum for example. The conductive line 128 is a top conductive line, a top metal line or a top metal layer. Alternatively, the conductive line 128 is a metal line or conductive line which is second to the last metal layer of the interconnect metallization layers 122-128.

The component 100 further comprise a dielectric or insulation layer 140 disposed on the interconnect metallization layer stack 120. The insulation layer 140 may comprise a dielectric material. For example, the insulation layer 140 comprises silicon oxide, low dielectric constant materials or ultra-low dielectric constant materials (low-k materials).

In one embodiment the insulation layer 140 comprises a brittle material. A material is brittle if, when subjected to stress, it breaks without significant deformation (e.g., strain). Brittle materials absorb relatively little energy prior to fracture. This is true even for those brittle materials of high strength. Brittle material may include most ceramics and glasses (which do not deform plastically) and some polymers, such as polystyrene. The insulation layer 140 may be more brittle than the metal line of the metallization structure 120.

A passivation layer 150 may be disposed on the dielectric or insulation layer 140. The passivation layer 150 may comprise SiN. The passivation layer 150 may provide a top surface or first main surface of the component 100.

The passivation layer 150 may isolate and structure a component contact pad or bond pad 160. The component contact pad 160 is configured to be electrically connected to a component carrier contact pad on a component carrier, for example. The component 100 may comprise more than one bond pad 160. For example, the component 100 comprises two bond pads 160 on its top surface. The bond pad 160 may comprise a metal such as aluminum (Al) or copper (Cu).

The bond pad 160 is electrically connected to a portion of the top metal layer 128 through a via 145 in the insulation layer 140. The via 145 may comprise a metal such as copper (Cu) or aluminum (Al). Alternatively, the via 145 may comprise other conductive materials.

The component 100 further comprises a metal barrier layer 170 disposed on the top metal layer 122 and a ductile metal layer 180 disposed on the metal barrier layer 170. The metal barrier layer 170 is configured to prevent diffusion of the metal of the ductile metal layer 180 into the metal of the top metal layer 122. Moreover, the metal barrier layer 170 is configured to prevent a reaction of the metal of the ductile metal layer 180 with the metal of the top metal layer 128. Finally, the metal barrier layer 170 is configured to keep the metal of the ductile metal layer ductile.

The metal barrier layer may comprise tungsten (W), titanium (Ti), titanium nitride (TiN), tantalum (Ta), tantalum nitride (TaN), or a combination thereof. The metal barrier layer 170 may comprise a layer stack of different materials. The metal barrier layer 170 may be a sandwich layer sandwiched between the ductile metal layer 180 and the top metal layer 122.

The ductile metal layer 180 may comprise a ductile material. The ductile material may comprise a high degree of ductility or a higher degree of ductility than the metal of the top metal layer 128 and/or the bond pad 160. For example, the ductile material may comprise a yield stress of less than about 20 MPa. Alternatively, the ductile material may comprise a yield stress of less than about 15 MPa or even less than about 10 MPa. In one embodiment the ductile metal is a metal which can be deformed more than 10% prior breaking.

The ductile metal may comprise a solder material. For example, the ductile material may comprise tin (Sn, 9 to 14 MPa). Alternatively, the ductile material may comprise aluminum (Al, 7 to 11 MP) or Indium (In, 2 to 5 MPa). The aluminum (Al) may be pure, undoped aluminum.

In one embodiment the ductile metal layer 180 and metal barrier layer 170 may be disposed over the entire top metal layer 128. Alternatively, the ductile metal layer 180 and the metal barrier layer 170 may be disposed selectively. The ductile metal layer 180 and the metal barrier layer 170 may be disposed beneath or under the bond pad(s) 160. The metal barrier layer 170 and the ductile metal layer 180 may comprise a metal plate disposed in parallel to the bottom surface 162 of the bond pad 160. The metal plate may comprise the area of the bond pad +/−10%, for example. The metal plate may be a continuous metal plate or may not be a continuous metal (e.g., comprises gaps).

In one embodiment the via 145 may sit directly on the ductile metal layer 180 and is connected to the top metal layer 128 through the metal barrier layer 170 and the ductile metal layer 180. Alternatively, the via 145 may sit directly on the top metal layer 128. The metal barrier layer 170 and ductile metal layer 180 may be structured so that the area where the via 145 connects to the top metal layer 128 is metal barrier layer and/or ductile metal layer free.

In one embodiment the top metal layer 128 comprises the bond pad 160 and the ductile metal layer 180 and the barrier layer 170 are disposed on a layer below the top metal layer (e.g., layer 126). The ductile metal layer 180 may be between any of the metal layers (e.g., 122-126). Moreover, there may be several ductile metal layers 180 between the metal layer, e.g., one between layer 122 and layer 124 and one between layer 124 and 126.

Figure 1B:
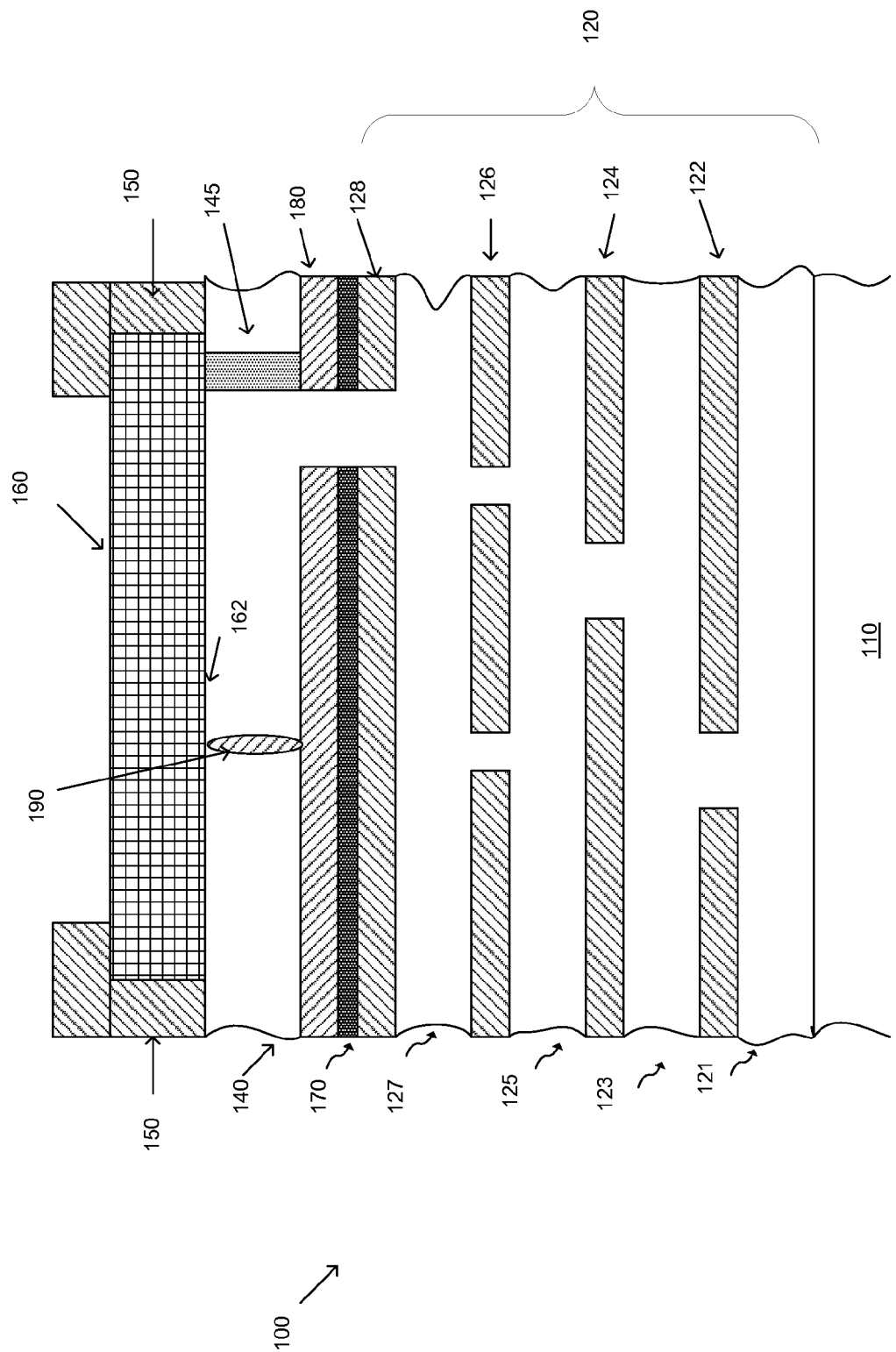
FIG. 1b shows an embodiment of a detail of a component comprising a crack.

FIG. 1*b* shows the component 100 comprising a crack 190 in the insulation layer 140. The crack may occur while the component is wire bonded, while it is electrically tested, or while the packaged electrical component is cut or singulated. The crack 190 is filled with the material of the ductile metal layer 180 forming an electrical connection between the top metal layer 122 and the bond pad 160. The material of the ductile material layer moves or flows into the crack because of internal pressure. The metal filled crack generates a short connection between the bond pad 160 and the top metal layer 128 of the interconnect metallization structure 120 when a voltage is applied. The short is measurable during final electrical test.

Figure 2A:
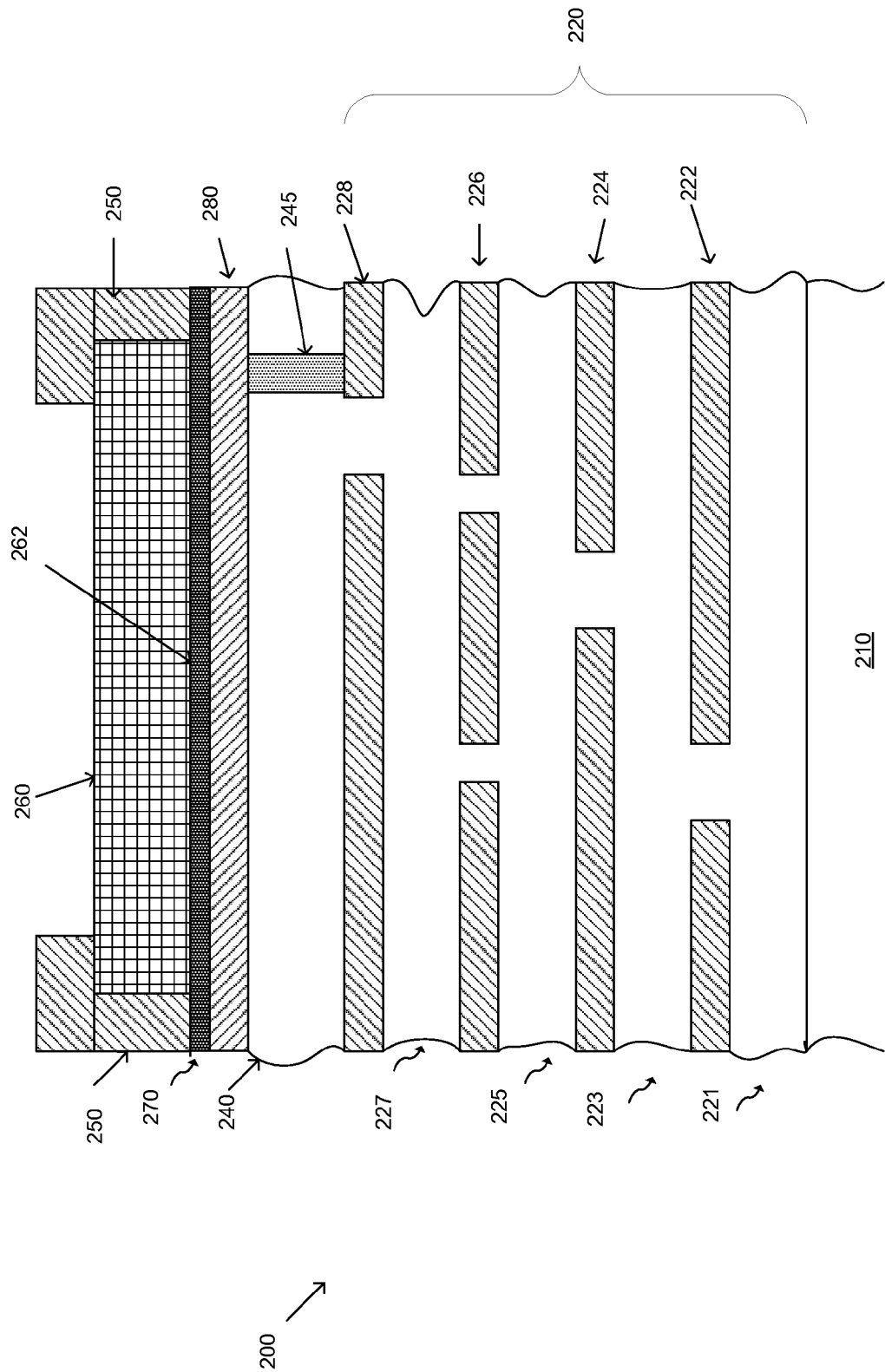
FIG. 2a shows an embodiment of a detail of a component.

FIG. 2*a* shows an embodiment of a component 200 comprising a crack detection structure. The component 200 comprises a workpiece or substrate 210 and an interconnect metallization structure 220 disposed thereon. The substrate 210 may be a semiconductor substrate such as silicon or germanium, or a compound substrate such as SiGe, GaAs, InP, GaN, SiC, or alternatively other materials. The semiconductor substrate may be a single crystal silicon or a silicon-on insulator (SOI). The substrate may be doped or undoped and may comprise one or more wells.

The interconnect metallization structure 220 may comprise one or more interconnect metallization layers 222-228. The interconnect metallization structure 220 is a mesh of conductive lines and plugs/vias (not shown) embedded in an insulation material 221-227. For example, the interconnect metallization structure may comprises four metallization levels 222-228 separated from each other by three insulation layers 223-227 (vias connecting the metallization levels are not shown in the interconnect metallization structure). The insulation material of the insulation layers 223-227 comprises silicon dioxide, low dielectric constant materials or ultra low dielectric constant materials (low-k materials). Low-k materials have a k value less than the k value of silicon dioxide. The conductive lines and plugs/vias may comprise a metal such as copper or aluminum. The conductive line 228 is a top conductive line, a top metal line or a top metal layer. Alternatively, the conductive line 228 is a metal line or conductive line which is second to the last metal layer of the interconnect metallization layers 222-228.

The component 200 further comprise a dielectric or insulation layer 240 disposed on the interconnect metallization layer stack 220. The insulation material 240 comprises silicon oxide, low dielectric constant materials or ultra low dielectric constant materials.

A passivation layer 250 may be disposed on the dielectric or insulation layer 240. The passivation layer may comprise SiN, for example. The passivation layer 250 may provide a top surface or first main surface of the component 200.

The passivation layer 250 may isolate and structure a component contact pad or bond pad 260. The component contact pad 260 is configured to be electrically connected to component carrier contact pad of a component carrier. The component 200 may comprise more than one bond pad 260. For example, the component 200 may comprise two bond pads 260 on its top surface. The bond pad 260 may comprise a metal such as aluminum (Al) or copper (Cu).

The bond pad 260 is electrically connected to a portion of the top metal line 228 through a via 245 in the insulation layer 240. The via 245 may comprise a metal such as copper (Cu) or aluminum (Al). Alternatively, the via 245 may comprise other conductive materials.

The component 200 further comprises a ductile metal layer 280 disposed beneath the bond pad 260 and a metal barrier layer 270 disposed between ductile metal layer 280 and the bond pad 260. The metal barrier layer 270 is configured to prevent diffusion of the metal of the ductile metal layer 280 into the metal of the bond pad 260. Moreover, the metal barrier layer 270 is configured to prevent a reaction of the metal of the ductile metal layer 280 with the metal of the bond pad 260. Finally, the metal barrier layer 270 is configured to keep the metal of the ductile metal layer ductile.

The metal barrier layer may comprise tungsten (W), titanium (Ti), titanium nitride (TiN), tantalum (Ta), tantalum nitride (TaN), or a combination thereof. The metal barrier layer 270 may comprise a plurality of layers of different materials. The metal barrier layer 270 may be a sandwich layer sandwiched between the ductile metal layer 280 and the bond pad 260.

The ductile metal layer 280 may comprise a ductile material. The ductile material may comprise a high degree of ductility or a higher degree of ductility than the metal of the top metal layer 228 and/or the bond pad 260. For example, the ductile material may comprise a yield stress of less than about 20 MPa. Alternatively, the ductile material may comprise a yield stress of less than about 15 MPa or even less than about 10 MPa. In one embodiment the ductile metal is a metal which can be deformed more than 10% prior breaking.

The ductile metal may comprise a solder material. For example, the ductile material may comprise tin (Sn, 9 to 14 MPa). Alternatively, the ductile material may comprise aluminum (Al, 7 to 11 MP) or Indium (In, 2 to 5 MPa). The aluminum (Al) may be pure, undoped aluminum.

In one embodiment the ductile metal layer 280 and metal barrier layer 270 may be disposed over the entire top metal layer 228. Alternatively, the ductile metal layer 280 and the metal barrier layer 270 may be disposed selectively. The ductile metal layer 280 and the metal barrier layer 270 may be disposed beneath or under the bond pad(s) 260. The metal barrier layer 270 and the ductile metal layer 280 may comprise a metal plate disposed in parallel to the bottom surface 262 of the bond pad 260. The metal plate may comprise the area of the bond pad +/−10%, for example. The metal plate may be a continuous metal plate. In one embodiment the metal barrier layer 270 and the ductile metal layer 280 comprise a metal plate disposed in parallel to a bottom surface 262 of the bond pad 260. The metal plate may cover the entire bond pad 260 area or may cover the bond pad 260 area except for the via contact 245.

In one embodiment the via 245 may connect directly to the ductile metal layer 280 and may be connected to the bond pad 260 through the metal barrier layer 270 and the ductile metal layer 280. Alternatively, the via 245 may connect directly to the bond pad 260. The metal barrier layer 270 and ductile metal layer 280 may be structured so that the area where the via 245 is connected to the bond pad 260 is metal barrier layer 270 and/or ductile metal layer 280 free.

In one embodiment the top metal layer 228 comprises the bond pad 260 and the ductile metal layer 280 and the barrier layer 270 are disposed underneath the top metal layer 228 (e.g., directly underneath the top metal layer). The ductile metal layer 280 may be between any of the metal layers (e.g., 222-226). Moreover, there may be several ductile metal layers 280 between the metal layer, e.g., one between layer 222 and layer 224 and one between layer 224 and 226.

Figure 2B:
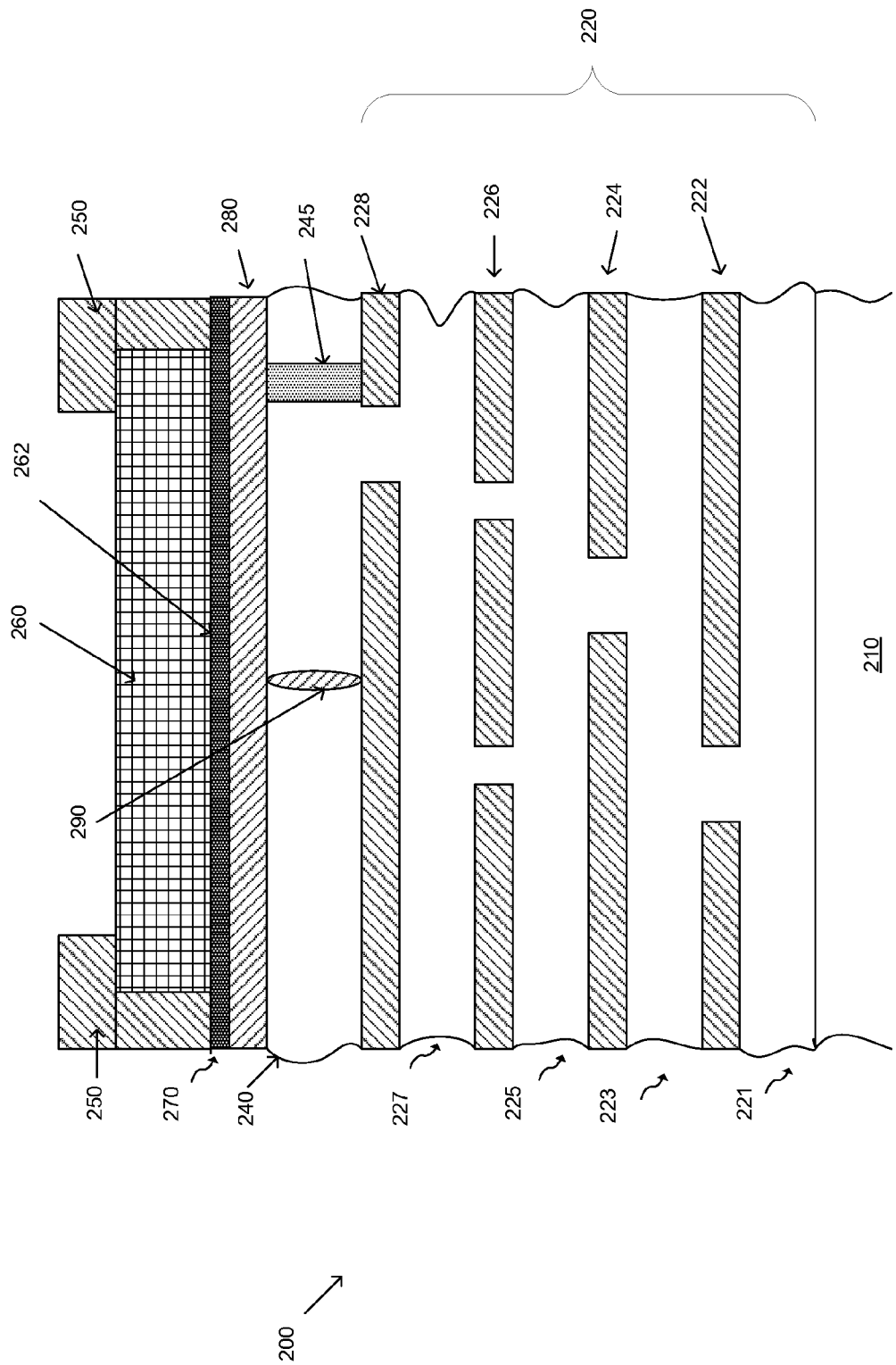
FIG. 2b shows an embodiment of a detail of a component comprising a crack.

FIG. 2b shows the component 200 comprising a crack 290 in the insulation layer 240. The crack 290 may occur while the component is wire bonded, while it is electrically tested, or while the packaged electrical component is cut or singulated. The crack 290 is filled with the material of the ductile metal layer 280 forming an electrical connection between the top metal layer 228 and the bond pad 260. The material of the ductile material layer flows into the crack because of internal pressure. The metal filled crack 290 generates a short connection between the bond pad 260 and the top metal layer 228 of the interconnect metallization structure 220 when a voltage is applied to the component. The short is measurable during final electrical test.

Figure 3A:
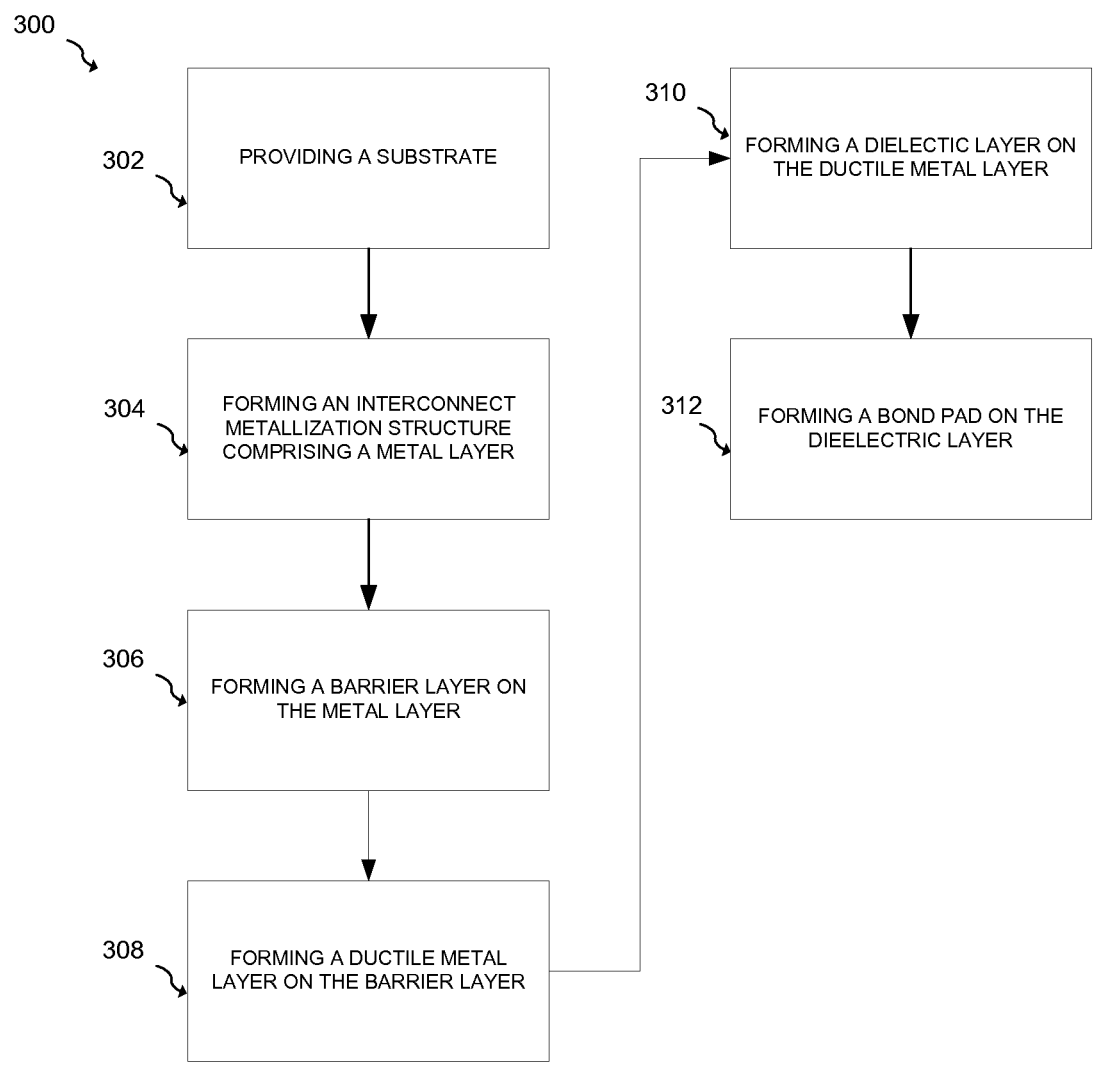
FIG. 3a shows an embodiment of a method of manufacturing a component.

FIG. 3a shows a flowchart 300 of an embodiment of a method to manufacture a semiconductor device comprising crack detection structure. In a first step 302 a substrate is provided. The substrate may be a semiconductor substrate such as silicon or germanium, or a compound substrate such as SiGe, GaAs, InP, GaN, SiC, or alternatively other materials. The semiconductor substrate may be a single crystal silicon or a silicon-on insulator (SOI). The semiconductor substrate may be doped or may comprise one or more wells. The substrate may comprise a single transistor or a plurality of transistors. The substrate may comprise other devices such as capacitors or diodes.

In step 304 an interconnect metallization structure is formed over the substrate. The interconnect metallization structure may be formed applying single damascene processes or dual damascene processes. In a dual damascene technique, a via layer and a metallization layer are formed at once, by patterning one insulating material layer using two lithography masks and processes, and then filling the patterned insulating material layer with a conductive material. The dual damascene processes may be via-first, wherein a via level is patterned before a conductive line layer is patterned, or via-last, wherein a conductive line layer is patterned before a via level is patterned. Alternatively, the vias/plugs and the conductive segments may be patterned using a subtractive etch process, by sequentially depositing conductive material layers over the substrate and patterning the conductive material and then forming an insulating material between the patterned conductive materials. The interconnect metallization structure comprises a top metal layer, a top conductive line, or a top metal line.

In step 306 a metal barrier layer is formed on a metal layer. The metal barrier layer may be formed on any of the metal layers of the interconnect metallization structure. In one embodiment the metal barrier layer is formed on the top metal layer. Alternatively, the metal barrier layer is formed on the metal layer which is the metal layer second to last of the metal layers of the interconnect metallization structure. The metal barrier layer may be a single layer such as tungsten (W), titanium (Ti), titanium nitride (TiN), tantalum (Ta) or tantalum nitride (TaN), or may be a layer stack such as Ti/TiN or Ta/TaN. The metal barrier layer may be a thin layer. The metal barrier layer may be formed using a chemical vapor deposition process (CVD), a physical vapor deposition process (PVD) or an atomic layer deposition process (ALD).

The metal barrier layer may be formed covering the top metal layer area(s) underneath the bond pad(s). The metal barrier layer may cover about the area of the bond pad which can be defined as the bond pad area plus up to an additional 10% of that area.

In step 308 a ductile metal layer is formed on the metal barrier layer. The ductile metal layer may be a material which is more ductile than the material of the top metal layer and/or the material of dielectric layer (described below). The ductile metal layer may comprise a solder material such as tin (Sn) or aluminum (Al). The ductile metal layer may be a single metal material or an alloy. The ductile metal layer may be formed using a chemical vapor deposition process (CVD), a physical vapor deposition process (PVD) or an atomic layer deposition process (ALD).

In step 310 a dielectric layer or an insulation layer is formed on the ductile metal layer. The material of the insulation layer comprises silicon oxide, low dielectric constant materials or ultra low dielectric constant materials. A via is formed in the insulation layer to connect a particular conductive line to the bond pad. The via is filled with a conductive material such as copper (Cu) or aluminum (Al).

Finally, in step 312 a bond pad is formed on the insulation layer. The bond pad is configured to be bonded to a wire. The bond pad may comprise copper (Cu) or aluminum (Al).

Figure 3B:
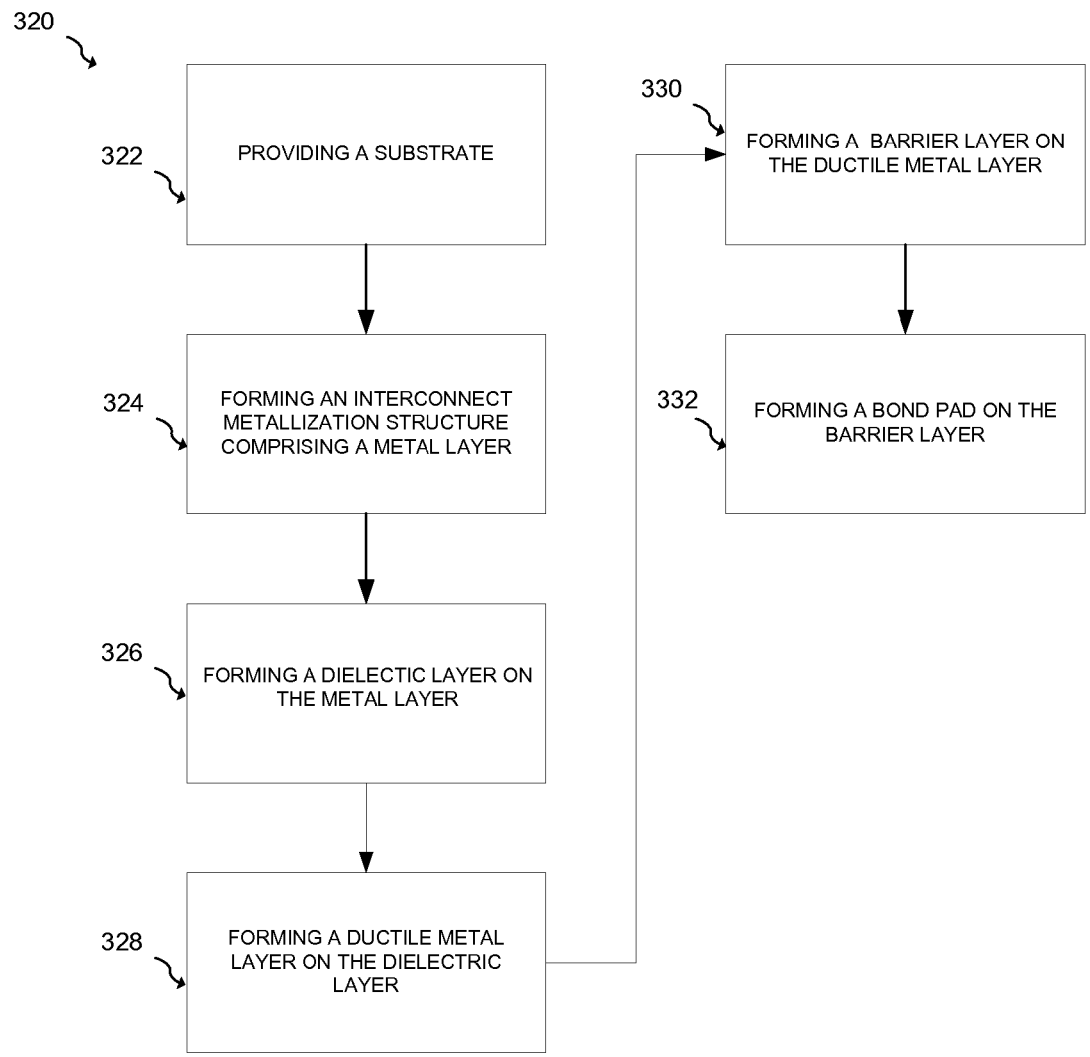
FIG. 3b shows an embodiment of a method of manufacturing a component.

FIG. 3b shows a flowchart 320 of another embodiment of a method to manufacture a semiconductor device comprising crack detection structure. In a first step 322 a substrate is provided. The substrate may be a semiconductor substrate such as silicon or germanium, or a compound substrate such as SiGe, GaAs, InP, GaN, SiC, or alternatively other materials. The semiconductor substrate may be a single crystal silicon or a silicon-on insulator (SOI). The semiconductor substrate may be doped or may comprise one or more wells. The substrate may comprise a single transistor or a plurality of transistors. The substrate may comprise other devices such as capacitors or diodes.

In step 324 an interconnect metallization structure is formed over the substrate. The interconnect metallization structure may be formed applying single damascene processes or dual damascene processes. In a dual damascene technique, a via layer and a metallization layer are formed at once, by patterning one insulating material layer using two lithography masks and processes, and then filling the patterned insulating material layer with a conductive material. The dual damascene processes may be via-first, wherein a via level is patterned before a conductive line layer is patterned, or via-last, wherein a conductive line layer is patterned before a via level is patterned. Alternatively, the vias/plugs and the conductive segments may be patterned using a subtractive etch process, by sequentially depositing conductive material layers over the substrate and patterning the conductive material and then forming an insulating material between the patterned conductive materials. The interconnect metallization structure comprises a top metal layer, a top conductive line, or a top metal line.

In step 326 a dielectric layer or an insulation layer is formed on a metal line. The dielectric layer may be formed on any of the metal layers of the interconnect metallization structure. In one embodiment the dielectric layer is formed on the top metal layer of the metallization structure. Alternatively, the dielectric layer is formed on the second to last of the metal layers of the metallization structure. The material of the insulation layer comprises silicon oxide, low dielectric constant materials or ultra low dielectric constant materials. A via is formed in the insulation layer to connect a particular conductive line of a metal layer to the bond pad. The via is filled with a conductive material such as copper (Cu) or aluminum (Al).

In step 328 a ductile metal layer is formed on the insulation layer. The ductile metal layer may be formed over the entire insulation layer or only over portions under the bond pad. The ductile metal layer may cover the entire bond pad area or about the entire bond pad area. For example, the ductile metal layer may be formed covering the pad area(s) plus up to an additional 10% of that area.

The ductile metal layer may be a material which is more ductile than the material of the bond pad and/or the dielectric layer. The ductile metal layer may comprise a solder material such as tin (Sn). The ductile metal layer may be a single metal or a metal alloy. The ductile metal layer may be formed using a chemical vapor deposition process (CVD), a physical vapor deposition process (PVD) or an atomic layer deposition process (ALD).

In step 330 a metal barrier layer is formed on the ductile metal layer. The metal barrier layer may be a single layer such as tungsten (W), titanium (Ti), titanium nitride (TiN), tantalum (Ta) or tantalum nitride (TaN), or may be a layer stack such as Ti/TiN or Ta/TaN. The metal barrier layer may be a thin layer. The metal barrier layer may be formed using a chemical vapor deposition process (CVD), a physical vapor deposition process (PVD) or an atomic layer deposition process (ALD).

Finally, in step 332 a bond pad is formed on the metal barrier layer. The bond pad is configured to be bonded to a wire. The bond pad may comprise copper (Cu) or aluminum (Al).

Figure 4:
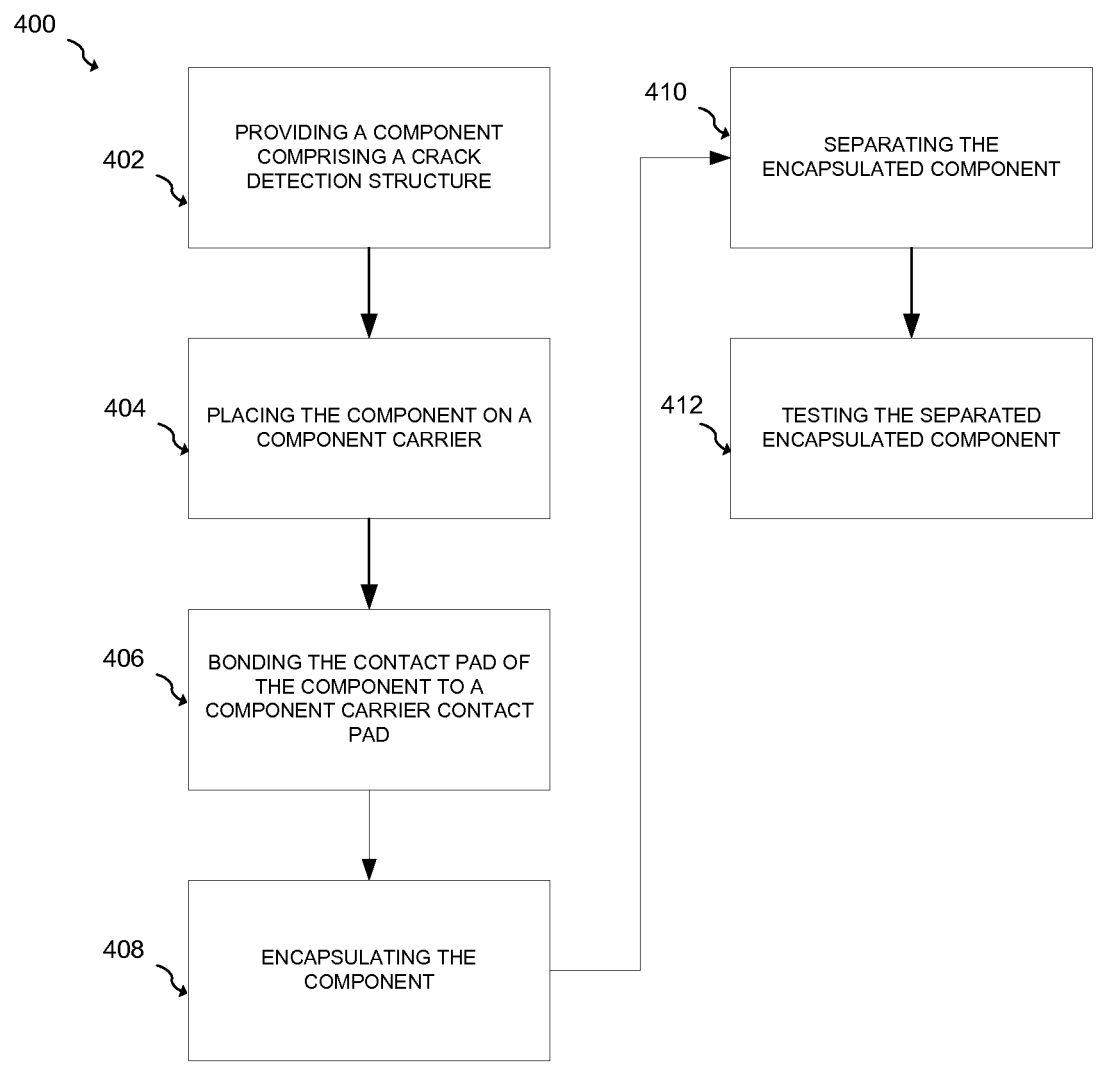
FIG. 4 shows an embodiment of a method of testing a component.

FIG. 4 shows a flowchart 400 of another embodiment of a method to manufacture and test a component comprising crack detection structure. In a first step 402 a component is provided. The component may be a discrete device such as a single semiconductor device or an integrated circuit (IC). For example, the component is a semiconductor device or a power semiconductor device such as a bipolar transistor, an insulated gate bipolar transistor (IGBT), a power MOSFET, a thyristor or a diode. Alternatively, the component is a resistor, a protective device, a capacitor, a sensor or a detector, for example.

In step 404, the component in placed on a component carrier. The component carrier may be a leadframe or a printed circuit board (PCB). The component is placed on a component placement area.

In step 406, the bond pad(s) of the component is/are bonded to component carrier contact pad(s). The component is electrically connected to the component carrier via a wire or a conductive clip. The component and the component carrier may be wire bonded or ball bonded. Alternatively, the component may be soldered to the component carrier.

In step 408 the component is sealed or encapsulated with an encapsulation material. The encapsulation material may comprise a molding compound, a laminate or a casing. The encapsulation material may partially encapsulate the component carrier and completely encapsulate the component. The encapsulation material may completely or partially encapsulate the wires and/or the conductive clips.

The encapsulation material may comprise thermosetting materials such as an epoxy, polyurethane or polyacryliate compound. Alternatively the encapsulation material may comprise thermoplastic materials such as polysulfones, polyphenylen sulfides, or polyetherimides. In one embodiment the encapsulation material may be a laminate such as a prepreg.

In an optional step 410 the encapsulated component is separated, singulated or cut from other encapsulated components. For example, a plurality of components is encapsulated on a leadframe. The leadframe and the encapsulation material are cut with a dicing saw or a dicing laser forming individual encapsulated components.

In the last step 412, the individual encapsulated components are tested and verified for reliability. For example, the encapsulated components are placed in a test tool, a voltage is applied to the bond pads and a current or voltage is measured. Connecting lines below a bond pad may connect directly or indirectly other bond pads. In case of a crack the bond pad is shorted with power/ground with the connecting lines below bond pad. The short circuit may be created by the ductile metal moving into a crack between the top metal layer of a interconnect metallization structure and a bond pad. If the voltage is above a certain predetermined value, the encapsulated component is a "good" component and if the voltage is below that predetermined value the encapsulated component is damaged and a short circuit occurred. Similarly, if the current is below a certain predetermined value, the encapsulated component is a "good" component and if the current is above that predetermined value the encapsulated component is damaged and a short circuit occurred. A standard leakage test may be able to detect the crack.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A component comprising:
    a first metal line disposed over a substrate;
    an insulating layer disposed over the first metal line;
    a second metal line disposed over and contacting the insulating layer;
    a ductile metal layer disposed between the first metal line and the second metal line, wherein the insulating layer is disposed over and contacting the ductile metal layer, wherein the ductile metal layer is composed of a different metal than the first metal line and the second metal line, and wherein the ductile metal layer has a different ductility than the first metal line and the second metal line, wherein the ductile metal layer comprises undoped aluminum and the first metal line comprises copper; and
    a metal barrier layer disposed between the first metal line and the second metal line, wherein the metal barrier layer is disposed directly on the first metal line, wherein the ductile metal layer is disposed directly on the metal barrier layer, and wherein the insulating layer is disposed directly on the ductile metal layer, wherein the second metal line comprises a bond pad, and wherein the ductile metal layer and the metal barrier layer are only disposed in an area below the bond pad.

2. The component according to claim 1, wherein the first metal line is a top metal line of an interconnect metallization structure.

3. The component according to claim 1, wherein the ductile metal layer has a higher ductility than the first metal line and the second metal line.

4. The component according to claim 1, wherein a yield strength of the ductile metal layer is less than about 20 MPa.

5. The component according to claim 1, wherein ductile metal layer is deformable to more than 10% prior to breaking.

6. The component according to claim 1, wherein the ductile metal layer comprises tin with a yield strength of 9 to 14 MPa.

7. The component according to claim 1, wherein the ductile metal layer comprises aluminum with a yield strength of 7 to 11 MPa.

8. The component according to claim 1, wherein the ductile metal layer comprises indium with a yield strength of 2 to 5 MPa.

9. A component comprising:
    an interconnect metallization structure disposed on a semiconductor substrate, the interconnect metallization structure comprising a plurality of metal levels including a lowermost metal level nearest to the semiconductor substrate and an uppermost metal level farthest from the semiconductor substrate, the uppermost metal level comprising a metal line;
    an insulating layer disposed on the uppermost metal level;
    a bond pad disposed on the insulating layer; and
    a conductive structure disposed in the uppermost metal level, the conductive structure comprising the metal line, a solder metal layer, and a metal barrier layer, wherein the metal line, the solder metal layer, and the metal barrier layer have a same patterned structure in the uppermost metal level,
    wherein the solder metal layer comprises a solder metal and is disposed between the bond pad and the metal line of the uppermost metal level, wherein the solder metal layer is disposed adjacent the metal line; and
    wherein the metal barrier layer is disposed between the solder metal layer and the metal line, wherein the metal barrier layer contacts a lower major surface of the solder metal layer and an upper major surface of the metal line, wherein the lower major surface faces the upper major surface.

10. The component according to claim 9, wherein the solder metal of the solder metal layer comprises a higher degree of ductility than a metal of the metal line or a metal of the bond pad.

11. The component according to claim 9, wherein a metal of the bond pad comprises aluminum, wherein a metal of the metal line comprises copper, and wherein the solder metal of the solder metal layer comprises tin.

12. The component according to claim 9, wherein the solder metal layer comprises a deformable solder metal with a yield strength less than about 20 MPa.

13. The component according to claim 9, wherein a solder metal of the solder metal layer is configured to move into a potential crack in the insulating layer.

14. An electronic device comprising:
- an interconnect metallization structure comprising a plurality of metal levels disposed over a substrate, wherein the interconnect metallization structure comprises a conductive metal line at an uppermost metal level of the plurality of metal levels;
- a metal barrier layer disposed over and contacting the conductive metal line;
- a deformable metal layer disposed over and contacting the metal barrier layer;
- an insulating layer disposed over the deformable metal layer;
- a contact pad disposed over the insulating layer, wherein the deformable metal layer comprises a different metal than the metal barrier layer, the conductive metal line, and the contact pad; and
- a via disposed over the interconnect metallization structure, wherein the via electrically connects the contact pad and the conductive metal line, wherein the deformable metal layer comprises a different metal than the via, wherein the contact pad comprises aluminum, wherein the conductive metal line comprises copper, wherein the deformable metal layer comprises undoped aluminum.

15. The device of claim 14, wherein the deformable metal layer is subjected to a compressive force.

16. The device of claim 14, wherein the via contacts the deformable metal layer and the contact pad.

17. The device of claim 14, wherein the deformable metal layer has a higher ductility than the conductive metal line and the contact pad.

* * * * *